United States Patent
Bhandari

(10) Patent No.: US 7,399,358 B2
(45) Date of Patent: Jul. 15, 2008

(54) SYNTHESIS OF LARGE HOMOEPITAXIAL MONOCRYSTALLINE DIAMOND

(76) Inventor: Rajneesh Bhandari, S 271 Mahaveer Nagar, Jaipur - 302018 (IN)

( * ) Notice: Subject to any disclaimer, the term of this patent is extended or adjusted under 35 U.S.C. 154(b) by 0 days.

(21) Appl. No.: 11/515,259

(22) Filed: Sep. 1, 2006

(65) Prior Publication Data

US 2007/0051300 A1    Mar. 8, 2007

(30) Foreign Application Priority Data

Sep. 5, 2005    (IN) .................... 2392/2005

(51) Int. Cl.
*C30B 25/12*    (2006.01)
(52) U.S. Cl. .................. 117/96; 117/68; 423/446
(58) Field of Classification Search ............ 117/1, 117/68, 96; 257/1; 438/1; 428/1; 423/1, 423/446

See application file for complete search history.

(56) References Cited

U.S. PATENT DOCUMENTS

| | | | | |
|---|---|---|---|---|
| 5,127,983 A | * | 7/1992 | Imai et al. ............. | 117/85 |
| 5,198,070 A | * | 3/1993 | Jones ..................... | 117/1 |
| 5,628,824 A | * | 5/1997 | Vohra et al. ........... | 117/101 |
| 6,132,816 A | | 10/2000 | Takeuchi et al. | |
| 2004/0175499 A1 | * | 9/2004 | Twitchen et al. ...... | 427/249.8 |

OTHER PUBLICATIONS

Chih-Shlue Yan; Yogesh K. Vohra; Ho-Kwang Mao; Russell J. Hemley "Very High Growth Rate Chemical Vapor Deposition of Single-Crystal Diamond" *Proceedings of the National Academy of Sciences of the United States of America (PNAS)*, vol. 99, Issue 20, p. 12523-12525,, Publication Date: Oct. 2002.

* cited by examiner

*Primary Examiner*—Felisa C Hiteshew
(74) *Attorney, Agent, or Firm*—William L. Botjer

(57) ABSTRACT

A method for producing a large homoepitaxial monocrystalline diamond. The method comprises placing at least two substrates in a substrate holder in a chemical vapor deposition (CVD) chamber. The substrates are positioned in such a manner that the growth faces of the substrates form a wedge. A diamond forming gas is provided adjacent to the substrates in the CVD chamber. The diamond forming gas is exposed to microwave radiation to generate a plasma. Then, the substrates are exposed to the plasma under such conditions that diamond growth occurs in the wedge between the substrates, to form a large homoepitaxial monocrystalline diamond.

16 Claims, 4 Drawing Sheets

SYNTHESIS OF LARGE HOMOEPITAXIAL MONOCRYSTALLINE DIAMOND

RELATED APPLICATIONS

This application claims priority of Indian Patent Application No: 2392/DEL/2005, filed on Sep. 05, 2005.

BACKGROUND

The present invention relates to the synthesis of large-sized diamonds. More specifically, the present invention relates to a method for joining diamond substrates to produce a large homoepitaxial monocrystalline diamond.

A natural diamond is a diamond that is formed naturally in the earth by the prolonged exposure of carbon-bearing materials to high pressure and temperature. Long periods of exposure to high pressures and temperatures make natural diamond crystals grow larger. Scientists have been able to produce synthetic diamonds in laboratory conditions, which have the same chemical composition and physical properties as natural diamonds. Synthetic diamonds are used in precision-cutting tools, heat sinks in electronics, telecommunications equipment, computers and integrated circuits, as anvils for pressure cells, and optical windows in laser equipment. Synthetic diamonds are also used in jewelry and ornaments. The price of a diamond is determined by the four 'Cs', i.e., cut, color, clarity and carat size. Other parameters being constant, the price of the diamond increases exponentially with its size.

Synthetic diamonds can be produced by a variety of methods. One such method uses high pressure high temperature (HPHT) to produce synthetic diamonds. A carbon substrate such as graphite is exposed to a pressure exceeding 50 kilobars and a temperature exceeding 1200° C. in the presence of a catalyst metal such as nickel, cobalt or iron, to grow a diamond. The diamond so produced is known as a HPHT grown diamond. However, it is generally difficult and expensive to produce a large-sized, high-quality monocrystalline diamond by the HPHT method. Another method, chemical vapor deposition (CVD), is used to synthesize diamonds from the gas phase at below atmospheric pressures and temperatures above 800° C. A mixture of hydrogen and a hydrocarbon gas is activated by a variety of methods, such as thermal (hot filament) or plasma (direct current, radio frequency or microwave) activation, or the use of a combustion flame (oxyacetylene or plasma torches). This dissociates the hydrogen gas into atomic hydrogen and the hydrocarbon gas into active carbon ions, atoms or CH radicals, which deposit on a substrate to form a diamond. The diamond so produced is known as a CVD grown diamond. A common disadvantage of existing CVD methods for the synthesis of diamonds is that the length and width of the CVD grown diamond is limited by the size of the substrate. Another limitation is the time taken by existing CVD methods to produce diamonds with a large volume and surface area. Existing CVD methods are time-consuming processes, since they take a large amount of time to produce diamonds with a large volume and surface area from a single substrate. Therefore, these methods are not very economical.

The applications of synthetic diamonds, particularly in electronics, suffer from the limitation that single diamond crystals with a large volume and surface area are not commercially available. Large single diamond crystals can be used in high pressure devices, large heat sinks for high power thermal management, large semiconductor devices, large infrared or high power microwave windows, electron field emission sources, and surface acoustic wave devices.

Hence, there exists a need for a method for producing a large homoepitaxial monocrystalline diamond with a large volume and surface area, in which the length and width of the diamond is not limited by the size of a substrate. Further, the method should be less time-consuming and more economical.

SUMMARY

Embodiments of the invention provide a method for joining at least two substrates to produce a large homoepitaxial monocrystalline diamond, for use in electronics and other scientific applications, as well as in jewelry and ornaments.

It is an object of the invention to provide a method for joining at least two substrates to produce a large homoepitaxial monocrystalline diamond with a large volume and surface area.

Yet another object of the invention is to provide a method for producing a large homoepitaxial monocrystalline diamond with a large volume and surface area, in which the length and width of the diamond is not limited by the size of a substrate.

In the preferred embodiment, the invention is directed to a method for joining at least two substrates to produce a large homoepitaxial monocrystalline diamond. The method comprises placing at least two substrates on a substrate holder in a chemical vapor deposition (CVD) chamber. The substrates are positioned in such a manner that the growth faces of the substrates form a wedge. A diamond forming gas is provided adjacent to the substrates in the CVD chamber. The diamond forming gas is exposed to microwave radiation to generate a plasma. Then, the substrates are exposed to the plasma under such conditions that diamond growth occurs in the wedge between the substrates, to form a large homoepitaxial monocrystalline diamond.

An advantage of the present invention is that it provides a large homoepitaxial monocrystalline diamond with a large volume and surface area.

Another advantage of the present invention is that it provides a method for producing a large homoepitaxial monocrystalline diamond with a large volume and surface area, in which the length and width of the diamond is not limited by the size of a substrate.

Yet another advantage of the present invention is that it is less time-consuming and more economical to produce a large homoepitaxial monocrystalline diamond by joining at least two substrates, than growing a large homoepitaxial monocrystalline diamond on a single substrate.

BRIEF DESCRIPTION OF THE DRAWINGS

Various embodiments of the invention will hereinafter be described in conjunction with the appended drawings provided to illustrate and not to limit the invention, wherein like designations denote like elements, and in which.

DESCRIPTION OF PREFERRED EMBODIMENTS

Figure 1:
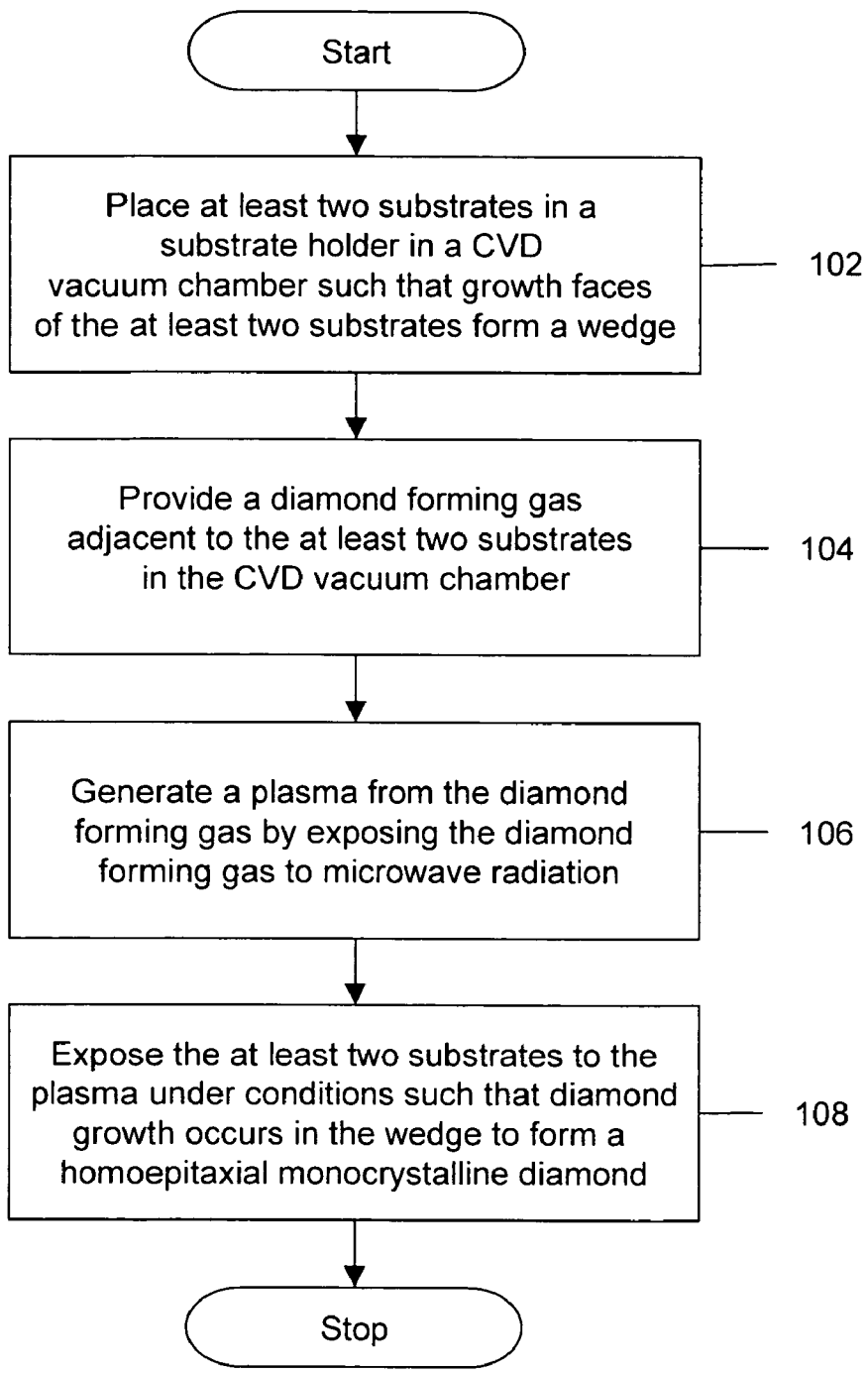
FIG. 1 is a flowchart illustrating a method for joining substrates to produce a large homoepitaxial monocrystalline diamond, in accordance with an embodiment of the invention.

For the sake of convenience, the terms used to describe various embodiments are described below. It should be understood that these are provided to merely aid the understanding of the description, and that definitions in no way limit the scope of the invention.

Natural diamond: A diamond formed naturally within the earth by prolonged exposure of carbon-bearing materials to high pressure and temperature.

Synthetic diamond: A man-made diamond with all the physical and chemical properties of the natural diamond.

Type Ia diamond: About 98% of natural diamonds are Type Ia, which are characterized by the presence of nitrogen in fairly substantial amount (up to 3000 ppm). Nitrogen is distributed in small aggregates substituting for neighboring carbon atoms.

Type Ib diamond: Type Ib diamonds are less than 1% in nature. Nitrogen is dispersed through the crystal structure as single substituting atoms.

Type IIa diamond: Type Ia diamonds are rare (1-2%) in nature. They are characterized by Nitrogen impurity levels, which are below the levels that can be detected by standard infrared techniques.

Type IIb diamond: Type IIb diamonds are extremely rare (0.1%) in nature. They have boron as impurity, which gives blue color.

High-pressure high-temperature (HPHT): A process in which a diamond is crystallized from metal solvated carbon at pressures of about 50-100 kbar and temperatures of about 1800-2300 K.

Chemical vapor deposition (CVD): A chemical process for depositing films of various materials—in a typical CVD process the substrate is exposed to one or more volatile precursors, which react and/or decompose on the substrate surface to produce the desired deposit. Frequently, volatile byproducts are also produced, which are removed by gas flow through the reaction chamber.

Wedge: This is any shape that is triangular in cross section.

Monocrystalline: Formed of a single crystal-unit such that all elements have identical crystallographic orientation of c- and a-axes and overgrow as one unit.

Crystallographic orientation: This is the orientation of a crystal face, as defined by miller indices.

(100) Crystallographic orientation: A face of a diamond which cuts only one axis (i.e., x) and is parallel to the other two axis (i.e., y and z) has (100) crystallographic orientation.

Homoepitaxial: Epitaxial deposition process in which the deposit & the substrate have same chemical composition & crystallographic orientation, for example, (111) oriented Si growing on (111) Si substrate.

Brilliant Cut: Diamonds fashioned in a round shape with 58 facets. It is the most efficient cut for diamonds cut from an octahedral rough.

Carat Weight: This is the unit of weight for diamonds and other precious stones–a Metric Carat=0.200 grams=100 points.

Colorless: A diamond with no body color, and which is completely transparent.

Emerald Cut: This refers to a rectangular shaped diamond with long parallel facets on the crown and the pavilion. Its overall shape is eight-sided.

Full Cut: This is a term used to describe diamonds with 58 facets.

Marquise Cut: A boat-shaped diamond that is pointed at both ends.

Pear Shape: This is a variation of the brilliant cut diamond with one pointed end and one rounded end.

Perfect Cut: This is a term used to describe a stone that has been cut to ideal proportions.

Princess Cut: This is a nearly square or rectangular stone with brilliant faceting above and below the girdle.

The present invention provides a method for joining substrates to produce a large homoepitaxial monocrystalline diamond.

The method involves placing at least two substrates in a substrate holder in a chemical vapor deposition (CVD) chamber. The substrate holder is modified such that the substrates placed on it form a wedge (i.e. are in a V shape). The substrate holder can be made from a suitable material, such as molybdenum and hexagonal boron nitride, which are thermally and chemically stable at high temperatures. However, the invention should not be construed to be limited only to the use of a substrate holder, made of molybdenum and hexagonal boron nitride. Other substrate holders, which are thermally and chemically stable at high temperatures can also be used without deviating from the scope of the invention. The substrates are positioned in such a manner that the growth faces of the substrates form the wedge (i.e. are in a V shape). A diamond forming gas is provided adjacent to the substrates in the CVD chamber. The diamond forming gas is exposed to microwave radiation to generate a plasma. The substrates are exposed to the plasma under such conditions that diamond growth occurs in the wedge between the substrates, to form a large homoepitaxial monocrystalline diamond.

FIG. 1 is a flowchart illustrating a method for joining substrates to produce a large homoepitaxial monocrystalline diamond, in accordance with an embodiment of the invention. At step 102, at least two substrates are placed on a substrate holder in a CVD vacuum chamber in such a manner that the growth faces of the substrates are positioned to form a wedge and the other faces are masked with the substrate holder. In accordance with one embodiment of the invention, two substrates are placed on the substrate holder. The two substrates are positioned on the substrate holder such that they are either separated on both the ends or are separated at one end and are touching each other at the other end. In various embodiments of the invention, the substrates are placed in a microwave plasma chemical vapor deposition (MPCVD) system. While placing the substrates in the MPCVD system, it is ensured that the growth faces of the substrates are (100) because (100) orientation favors diamond growth and the other faces, if any, are masked with the substrate holder. The substrates are cleaned prior to their being placed on the substrate holder. Cleaning of the substrates is done ultrasonically, using different liquid solvents in an ultrasonic cleaning device. The substrates are first cleaned with sulphuric acid in the ultrasonic cleaning device. After this, the substrates are washed with de-mineralized water in the ultrasonic cleaning device, which is then followed by their being washed with isopropyl alcohol in the ultrasonic cleaning device.

In an embodiment of the invention, the substrates are diamonds. The present invention is capable of using an HPHT grown synthetic diamond, a CVD grown synthetic diamond, and a natural diamond as substrates for growing large homoepitaxial monocrystalline diamonds. For example, in accordance with an exemplary embodiment of the invention, wherein the two substrates are used, one substrate may be an HPHT grown synthetic diamond, and another substrate may be a CVD grown synthetic diamond; one substrate may be a natural diamond and another substrate may be a CVD grown synthetic diamond; one substrate may be an HPHT grown synthetic diamond and another substrate may be a natural diamond. Further, both the substrates may be CVD grown synthetic diamonds, HPHT grown synthetic diamonds, or natural diamonds.

In various embodiments of the invention, the substrates are flat, rectangular plates with a length of 1 mm to 5 mm, a width of 1 mm to 5 mm, and a thickness of 0.25 mm to 3 mm. The substrates may be of any color or may be colorless. Further, the substrates may be of any shape such as a brilliant cut, a pyramid shape, a pear shape, and so forth.

At step 104, a diamond forming gas is provided adjacent to the substrates in the CVD chamber. The diamond forming gas contains a carbon containing substance and a carrier that is gaseous under plasma conditions. The carbon containing substance is a hydrocarbon of up to 5 carbon atoms. In an exemplary embodiment of the invention, the carbon containing substance is methane, and the carrier is hydrogen. The concentration of methane is 2 to 24 percent by volume of the diamond forming gas. However, the invention should not be construed to be limited only to the use of methane as the carbon containing substance. Other carbon containing substances such as acetylene, ethylene, propane, etc., can also be used without deviating from the scope of the invention. Other carriers such as halogens used alone or in combination with each other, and hydrogen, may also be used without deviating from the scope of the invention. It will be apparent to a person skilled in the art that the carrier serves many purposes such as stabilizing the substrates surfaces, dissolving the carbon in the gas, and generating condensable carbon radicals.

At step 106, a plasma is generated from the diamond forming gas by exposing the diamond forming gas to microwave radiation. However, the invention should not be construed to be limited only to the use of microwave radiation for generating the plasma. Other techniques for generating the plasma from the diamond forming gas, such as the application of a direct current or radio frequency radiation or employing a DC plasma jet or arc can also be availed of, without deviating from the scope of the invention.

At step 108, the substrates are exposed to the plasma generated at step 106 under pre-defined conditions, to form a diamond growth in the wedge between the substrates. It will be apparent to a person skilled in the art that the growth faces (100) of the substrates are exposed to the plasma, and the faces with a crystallographic orientation other than the (100) are masked with the substrate holder. The substrate holder is designed so that the substrates form a wedge with the growth faces (100) exposed to the plasma, and the faces with a crystallographic orientation other than the (100) are masked with the substrate holder. In an embodiment of the invention, the substrates are maintained at a temperature ranging from 800° C. to 1600° C. The CVD chamber is maintained at a pressure ranging from 80 to 220 torr. In various embodiments of the invention, the time period for synthesizing large homoepitaxial monocrystalline diamonds can be varied from 1 hour to 200 hours, depending on the thickness of the diamond growth required in the wedge between the substrates. In various embodiments of the invention, diamond growth occurs at the rate of 5 to 150 microns per hour. It will be apparent to a person skilled in the art that diamond growth rate depends on the conditions and the diamond forming gas used in the CVD chamber. In an embodiment of the invention, the large homoepitaxial monocrystalline diamond can have the length and width up to 20 mm.

In another embodiment of the invention, the two large homoepitaxial monocrystalline diamonds obtained in accordance with the method as described in FIG. 1, can be joined to form a still larger homoepitaxial monocrystalline diamond, without deviating from the scope of the invention.

The large homoepitaxial monocrystalline diamond is cut into desired shapes, such as a brilliant cut, an emerald cut, a full cut, a marquise cut, a perfect cut, a princess cut, and so forth, for use in jewelry and ornaments. Large homoepitaxial monocrystalline diamonds can also be used as flat plates, with a large volume and surface area for electronic and other scientific applications.

In an embodiment of the invention, dopants may be added along with the diamond forming gas to produce a colored diamond growth in the wedge between the substrates. For example, boron may be added in the form of diborane or tri methyl borate diluted in hydrogen to produce a blue-colored diamond growth, and nitrogen may be added in the form of nitrogen gas to produce a yellow or brown-colored diamond growth. However, the invention should not be construed to be limited to the use of only boron and nitrogen as the dopants. Other dopants such as oxygen, or any of the like can also be used without deviating from the scope of the invention. Further, it may be possible to obtain a bi-colored or multi-colored diamond growth in the wedge between the substrates by adding different dopants. For example, boron can be added for 12 to 24 hours to produce a blue-colored diamond growth, and then boron can be replaced by nitrogen for the next 12 to 24 hours to produce a yellow or brown-colored diamond growth. This will produce a bi-colored diamond growth in the wedge between the substrates, which is partly blue and partly yellow or brown. The quantity of dopants can also be varied with time to obtain variation in the color. A colored diamond growth can also be obtained by post-treating the homoepitaxial monocrystalline diamond with HPHT or irradiation. HPHT treatment at pressures ranging from 4 to 8 GPa and a temperature ranging from 1500° C. to 2400° C. changes the color of the diamond growth from yellow or brown to green or colorless. Post-treatment with irradiation changes the color of the diamond growth from yellow or brown to pink.

Figure 2:
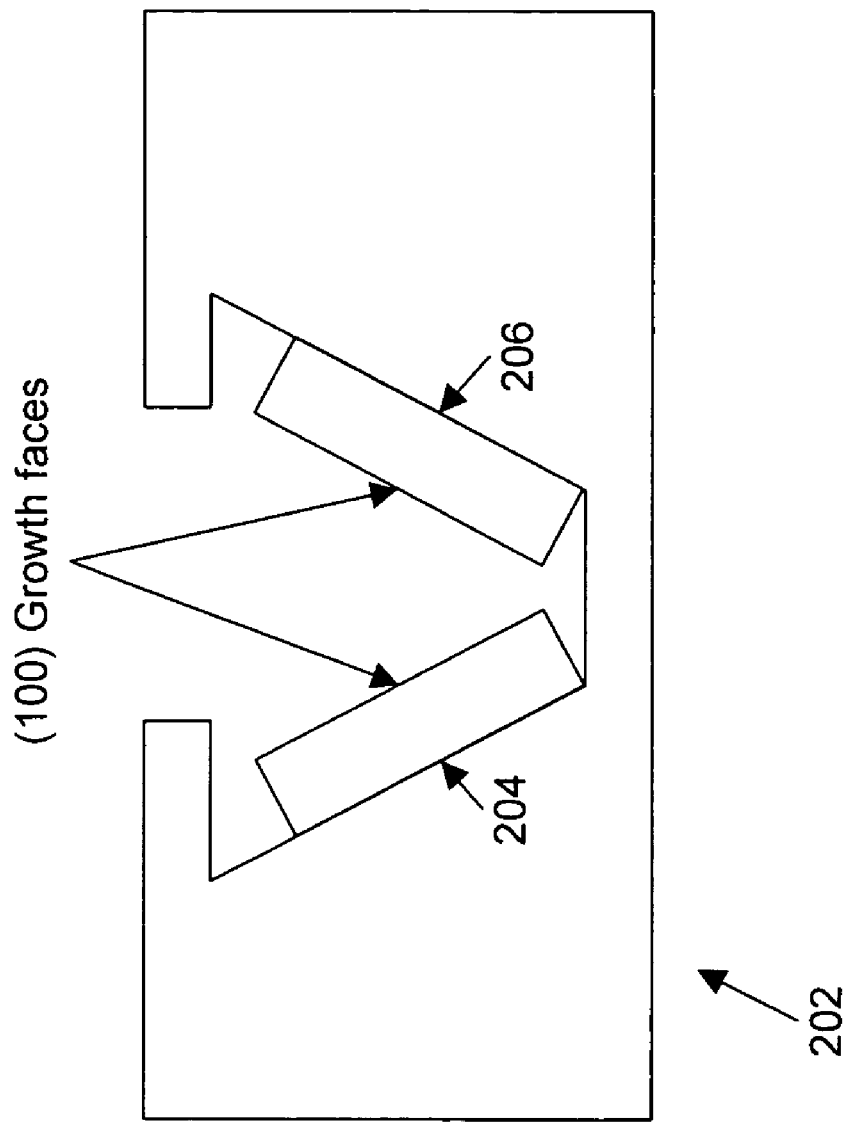
FIG. 2 is a block diagram of a substrate holder used for placing substrates which are joined to produce a large homoepitaxial monocrystalline diamond, in accordance with an embodiment of the invention.

FIG. 2 is a block diagram of a substrate holder 202 used for placing substrates which are joined to produce a large homoepitaxial monocrystalline diamond, in accordance with an embodiment of the invention. Substrate holder 202 is modified such that two substrates 204 and 206 placed on it form a wedge (i.e. are in a V shape). One possible design of a modified substrate holder is depicted in FIG. 2 in which substrates 204 and 206 form a wedge, in accordance with one embodiment of the invention. However, the invention should not be construed to be limited only to the design of substrate holder 202 as shown in FIG. 2. Other designs of substrate holder 202 are possible for placing substrates forming a wedge that can also be used, without deviating from the scope of the invention. Substrates 204 and 206 are positioned on substrate holder 202 in such a manner that the (100) growth faces of substrates 204 and 206 form the wedge (i.e. are in a V shape). Substrates 204 and 206 are positioned such that they are separated by on both the ends of substrates 204 and 206. The diamond growth takes place in the wedge between substrates 204 and 206 to form a large homoepitaxial monocrystalline diamond. The thickness of the large homoepitaxial monocrystalline diamond formed by joining substrates 204 and 206 depends on the thickness of the wedge or the separation between substrates 204 and 206 at the time of placing substrates inside substrate holder 202, before the start of the diamond deposition. Further, the time period for which diamond deposition takes place in the wedge also depends on the thickness of the wedge or the separation between substrates 204 and 206 at the time of placing substrates inside substrate holder 202, before the start of the diamond deposition.

Figure 3:
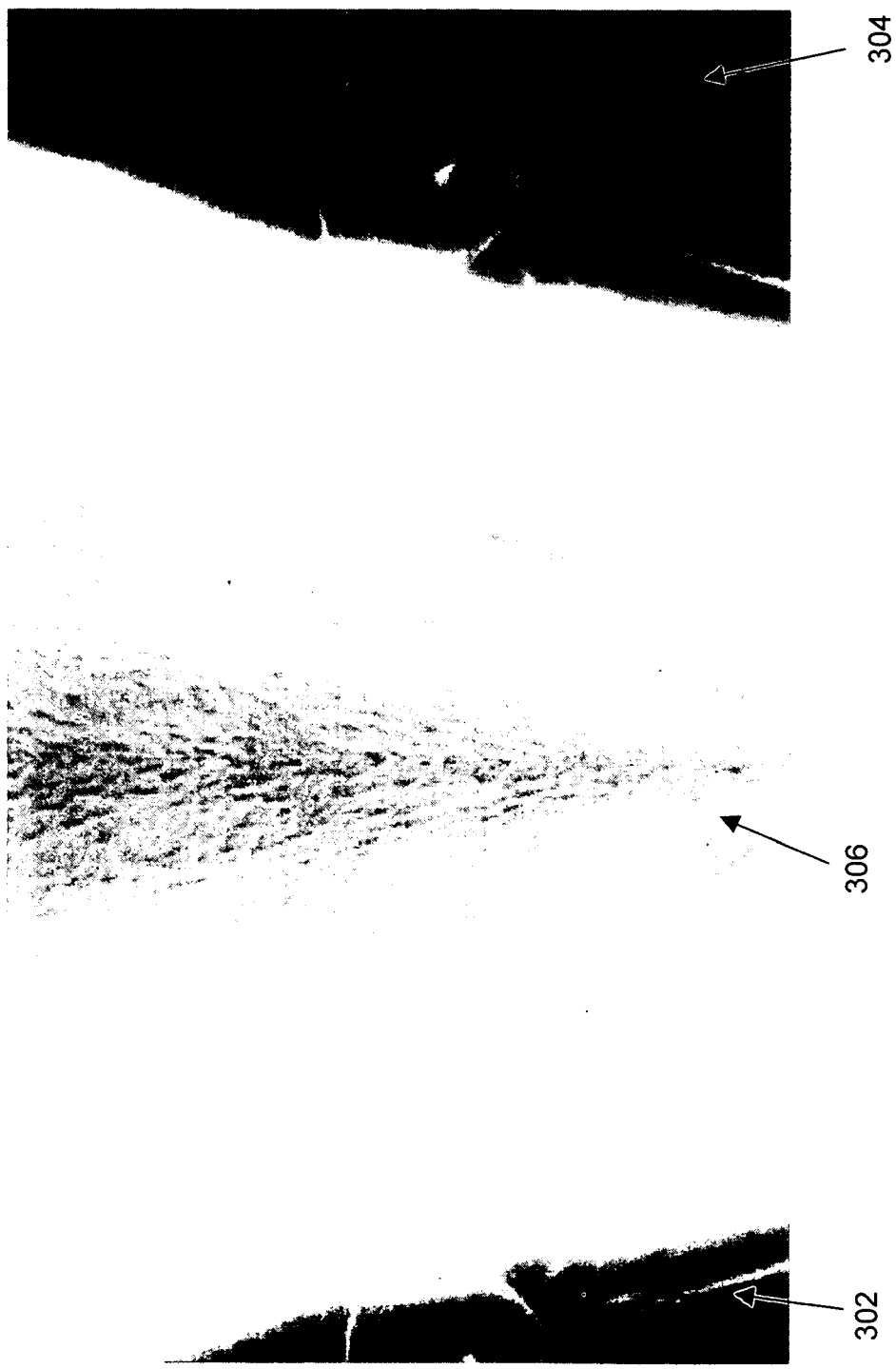
FIG. 3 is a scanning electron microscope image of a large homoepitaxial monocrystalline diamond produced by joining two CVD grown type IIa diamond plates, in accordance with an embodiment of the invention.

FIG. 3 is a scanning electron microscope image of a large homoepitaxial monocrystalline diamond produced by joining two CVD grown type IIa diamond plates, in accordance with an embodiment of the invention. As illustrated in FIG. 3, regions 302 and 304 show parts of the two CVD grown type IIa diamond plates or the substrates on which the diamond growth occurs. Region 306 shows the diamond growth that occurs in the gaps between the two CVD grown type IIa diamond plates that produces a large homoepitaxial monocrystalline diamond. The production of the large homoepitaxial monocrystalline diamond has been explained in conjunction with example 4.

Figure 4:
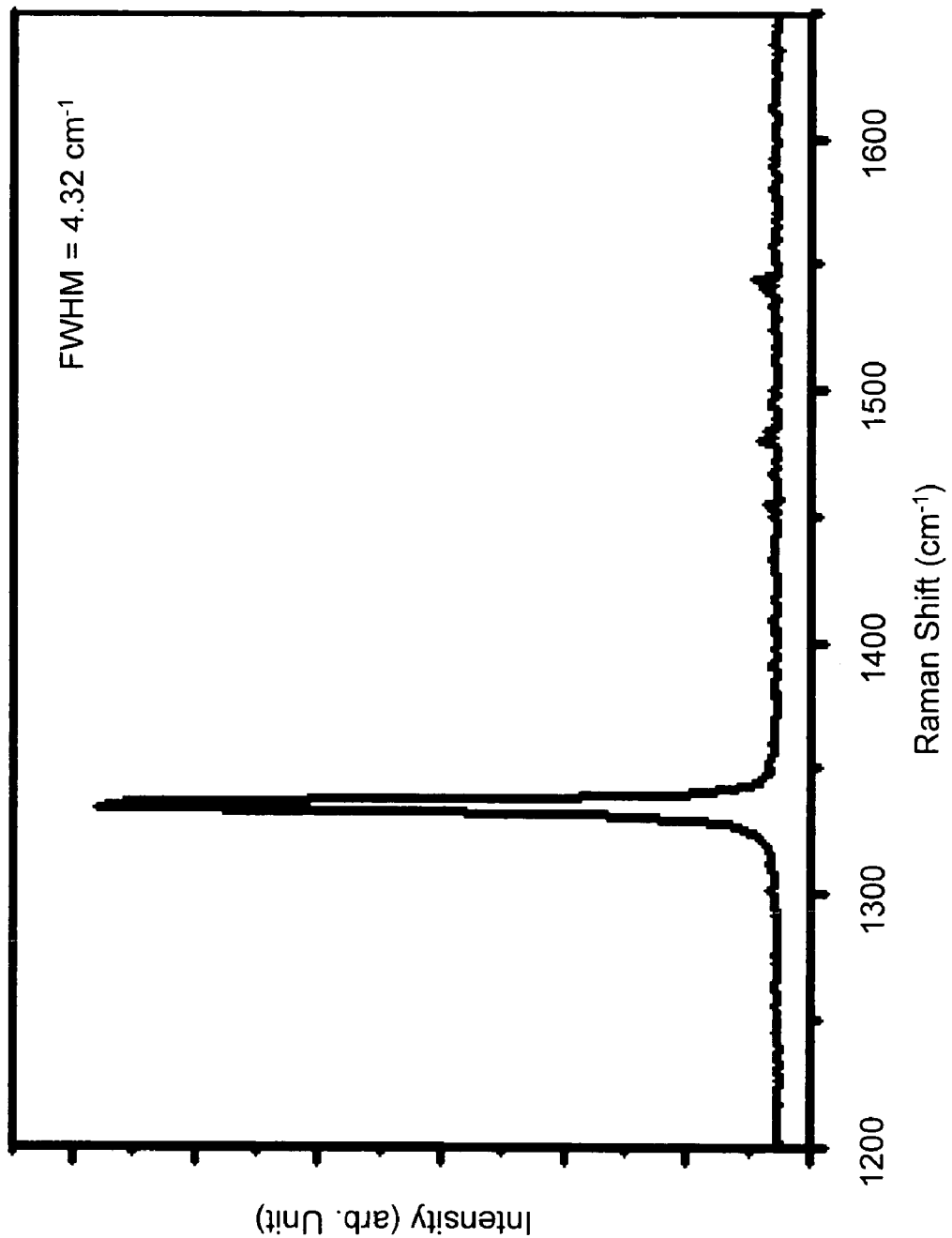
FIG. 4 is a graph illustrating Raman spectra of a large homoepitaxial monocrystalline diamond, in accordance with an embodiment of the invention.

FIG. 4 is a graph illustrating Raman spectra of a large homoepitaxial monocrystalline diamond produced in accordance with example 4 (explained later). FIG. 4 shows a characteristic diamond $sp^3$ peak at 1334 $cm^{-1}$ of the large homoepitaxial monocrystalline diamond. The Full-Width-at-Half-Maximum (FWHM) of the Raman spectrum indicates high crystalline quality of the large homoepitaxial monocrystalline diamond.

The following non-limiting examples are provided to illustrate the present invention:

EXAMPLE 1

Joining of Two Natural Type Ia Diamond Plates to Produce a Large Homoepitaxial Moncrystalline Diamond Two natural type 1a diamond plates, each with a length of 3 mm, a width of 3 mm, and a thickness of 0.5 mm, are cleaned in an ultrasonic cleaning device. The two natural type Ia diamond plates are first washed with sulphuric acid in the ultrasonic cleaning device. After this, they are washed with de-mineralised water and then in isopropyl alcohol in the ultrasonic cleaning device. After being cleaned, the two natural type Ia diamond plates are placed in the MPCVD system with a gap of 0.3 mm on one end and 0.5 mm on the other end to form a wedge. While placing the two natural type Ia diamond plates in the MPCVD system, it is ensured that their growth faces have a crystallographic orientation of (100) and the other faces, if any, are masked.

A diamond forming gas comprising hydrogen and methane is provided adjacent to the two natural type Ia diamond plates. The concentration of methane is 10 percent by volume in the diamond forming gas. Plasma is generated from the diamond forming gas by exposing it to microwave radiation. The growth faces (100) of the two natural type Ia diamond plates are exposed to the plasma, and the other faces with a crystallographic orientation other than the (100) are masked. The two natural type Ia diamond plates are maintained at temperatures ranging from 1050° C. to 1150° C. The MPCVD system is maintained at a pressure of 130 torr. Under these conditions, diamond growth occurs in the wedge between the two natural type Ia diamond plates. Diamond growth is maintained for 18 hours at an average growth rate of 22 microns per hour to form a large homoepitaxial monocrystalline diamond, with a length of 3 mm, a width of 3 mm, and a thickness ranging from 1.3 mm to 1.5 mm.

EXAMPEL 2

Joining of Two Type Ib HPHT Diamond Seeds to Produce a Large Homoepitaxial Moncrystalline Diamond Two type Ib HPHT diamond seeds, each with a length of 4 mm, a width of 4 mm and a thickness of 1.0 mm, are cleaned in an ultrasonic cleaning device. The two type Ib HPHT diamond seeds are first washed with sulphuric acid in the ultrasonic cleaning device. After this, they are washed with de-mineralised water and then in isopropyl alcohol in the ultrasonic cleaning device. After being cleaned, the two type Ib HPHT diamond seeds are placed in the MPCVD system with a gap of 0.5 mm on one end and 0.7 mm on the other end to form a wedge. While placing the two type Ib HPHT diamond seeds in the MPCVD system, it is ensured that their growth faces have a crystallographic orientation of (100) and the other faces, if any, are masked.

A diamond forming gas comprising hydrogen, methane and nitrogen is provided adjacent to the two type Ib HPHT diamond seeds. The concentration of methane is 14 percent by volume in the diamond forming gas. Plasma is generated from the diamond forming gas by exposing it to microwave radiation. The growth faces (100) of the two type Ib HPHT diamond seeds are exposed to the plasma, and the other faces with a crystallographic orientation other than the (100) are masked. The two type Ib HPHT diamond seeds are maintained at temperatures ranging from 1150° C. to 1225° C. The MPCVD system is maintained at a pressure of 170 torr. Under these conditions, diamond growth occurs in the wedge between the two type Ib HPHT diamond seeds. Diamond growth is maintained for 6.5 hours at an average growth rate of 90 microns per hour to from a large homoepitaxial monocrystalline diamond, with a length of 4 mm, a width of 4 mm, and a thickness ranging from 2.5 mm to 2.7 mm.

EXAMPLE 3

Joining of Two Natural Type Ia Diamond Plates to Produce a Large Homoepitaxial Moncrystalline Diamond Two natural type Ia diamond plates, each with a length of 3 mm, a width of 3 mm and a thickness of 1.0 mm, are cleaned in an ultrasonic cleaning device. The two natural type Ia diamond plates are first washed with sulphuric acid in the ultrasonic cleaning device. After this, they are washed with de-mineralised water and then in isopropyl alcohol in the ultrasonic cleaning device. After being cleaned, the two natural type Ia diamond plates are placed horizontally in the MPCVD system with a gap of 0.1 mm at the bottom and a gap of 0.15 mm at the top. While placing the two natural type Ia diamond plates in the MPCVD system, it is ensured that their growth faces have a crystallographic orientation of (100) and the other faces, if any, are masked.

A diamond forming gas comprising hydrogen, methane, and oxygen is provided adjacent to the two natural type Ia diamond plates. The concentration of methane is 6 percent by volume in the diamond forming gas. Plasma is generated from the diamond forming gas by exposing it to microwave radiation. The growth faces (100) of the two natural type Ia diamond plates are exposed to the plasma, and the other faces with the crystallographic orientation other than the (100) are masked. The two natural type Ia diamond plates are maintained at temperatures ranging from 1000° C. to 1100° C. The MPCVD system is maintained at a pressure of 120 torr. Under these conditions, diamond growth occurs in the gaps between the two natural type Ia diamond plates. The diamond growth is maintained for 8 hours at an average growth rate of 15 microns per hour to from a large homoepitaxial monocrystalline diamond, with a length of 6 mm, a width of 3 mm, and a thickness of 1.0 mm.

EXAMPLE 4

Joining of Two CVD Grown Type IIa Diamond Plates to Produce a Large Homoepitaxial Monocrystalline Diamond Two CVD grown type IIa diamond plates, each with a length of 3 mm, a width of 3 mm and a thickness of 1.0 mm each, are cleaned in an ultrasonic cleaning device. The two CVD grown type IIa diamond plates are first washed with sulphuric acid in the ultrasonic cleaning device. After this, they are washed with de-mineralised water and then in isopropyl alcohol in the ultrasonic cleaning device. After being cleaned, the two CVD grown type IIa diamond plates are placed horizontally in the MPCVD system with a gap of 0.2 mm at the bottom and a gap of 0.25 mm at the top. While placing the CVD grown type IIa diamond plates in the MPCVD system, it is ensured that their growth faces have a crystallographic orientation of (100) and the other faces, if any, are masked.

A diamond forming gas comprising hydrogen and methane is provided adjacent to the two CVD grown type IIa diamond plates. The concentration of methane is 12 percent by volume in the diamond forming gas. Plasma is generated from the diamond forming gas by exposing it to microwave radiation. The growth faces (100) of the two CVD grown type IIa diamond plates are exposed to the plasma, and the other faces with the crystallographic orientation other than the (100) are masked. The two CVD grown type IIa diamond plates are maintained at temperatures ranging from 1080° C. to 1150° C. The MPCVD system is maintained at a pressure of 140 torr. Under these conditions, diamond growth occurs in the gaps between the two CVD grown type IIa diamond plates. The diamond growth is maintained for 6 hours at an average growth rate of 37 microns per hour to from a large homoepitaxial monocrystalline diamond, with a length of 6 mm, a width of 3 mm, and a thickness of 1.0 mm.

EXAMPLE 5

The two homoepitaxial monocrystalline diamonds produced by the method as described in example 4, each with a length of 6 mm, a width of 3 mm, and a thickness of 1.0 mm are placed horizontally in the MPCVD system with a gap of 0.2 mm at the bottom and a gap of 0.25 mm at the top. According to the process as described in example 4, the diamond growth is maintained for 6 hours at an average growth rate of 37 microns per hour to from a large homoepitaxial monocrystalline diamond, with a length of 6 mm, a width of 6 mm, and a thickness of 1.0 mm.

EXAMPLE 6

Joining of a Natural Type Ia Pyramid Shaped Diamond with a Natural Type Ia Diamond Plate to produce a Large Homoepitaxial Moncrystalline Diamond A natural type Ia pyramid shaped diamond, with a length of 3 mm, a width of 3 mm, and a height of 4.0 mm, and a natural type Ia diamond plate with a length of 3 mm, a width of 3 mm, and a height of 2.0 mm are cleaned in an ultrasonic cleaning device. The two substrates are first washed with sulphuric acid in the ultrasonic cleaning device. After this, they are washed with de-mineralised water and then in isopropyl alcohol in the ultrasonic cleaning device. After being cleaned, the two substrates are placed in the MPCVD system in a manner so that a wedge forms between the base of the natural type Ia pyramid shaped diamond and the natural type Ia diamond plate. While placing the natural type Ia pyramid shaped diamond and the natural type Ia diamond plate in the MPCVD system, it is ensured that their growth faces have a crystallographic orientation of (100) and the other faces, if any, are masked.

A diamond forming gas comprising hydrogen and methane is provided adjacent to the two natural type Ia diamond plates. The concentration of methane is 8 percent by volume in the diamond forming gas. Plasma is generated from the diamond forming gas by exposing it to microwave radiation. The growth faces (100) of the natural type Ia pyramid shaped diamond and the natural type Ia diamond plate are exposed to the plasma, and the other faces with a crystallographic orientation other than the (100) are masked. The natural type Ia pyramid shaped diamond and the natural type Ia diamond plate are maintained at temperatures ranging from 1080° C. to 1150° C. The MPCVD system is maintained at a pressure of 140 torr. Under these conditions, diamond growth occurs in the wedge between the base of the natural type Ia pyramid shaped diamond and the natural type Ia diamond plate. Diamond growth is maintained for 16 hours at an average growth rate of 37 microns per hour to form a large homoepitaxial monocrystalline diamond, with a height of 6 mm and a flat end with dimensions of 3 mm×3 mm. The large homoepitaxial monocrystalline diamond so obtained is used to make a brilliant cut diamond for use in jewelry and ornaments. Further, the brilliant cut diamond made according to the above process is larger in size than a diamond made by cutting the natural type Ia pyramid shaped diamond.

In light of the various embodiments described above, the method of the present invention produces a large homoepitaxial monocrystalline diamond with a large volume and surface area by joining at least two substrates. The large homoepitaxial monocrystalline diamond can be used for a variety of industrial uses, such as in high pressure devices, large heat sinks for high power thermal management, large semiconductor devices, large infrared or high power microwave windows, electron field emission sources, and surface acoustic wave devices. The homoepitaxial monocrystalline diamond can also be used in jewelry and ornaments. The embodiments of the present invention enable the production of large homoepitaxial monocrystalline diamonds so that the growth of the diamond is not limited by the size of a substrate. Further, the present invention enables joining of at least two substrates to produce a large homoepitaxial monocrystalline diamond, which is less time-consuming and more economical.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for joining substrates to produce a homoepitaxial monocrystalline diamond, the method comprising the steps of:

a. placing at least two substrates on a substrate holder in a chemical vapor deposition vacuum chamber wherein the at least two substrates are positioned with respect to each other such that growth faces of the at least two substrates form a wedge and other faces are masked, wherein the growth faces have a crystallographic orientation of (100);
b. providing a diamond forming gas adjacent to the at least two substrates in the chemical vapor deposition vacuum chamber;
c. generating a plasma from the diamond forming gas by exposing the diamond forming gas to microwave radiation; and
d. exposing the at least two substrates to the plasma under conditions wherein the diamond growth occurs in the wedge between the at least two substrates so that the at least two substrates are joined to form the large homoepitaxial monocrystalline diamond, wherein the at least two substrates are maintained at temperatures ranging from 800° C. to 1600° C.

2. The method of claim 1 wherein the at least two substrates are diamonds.

3. The method of claim 1 wherein the at least two substrates are selected from the group consisting of a HPHT grown synthetic diamond, a CVD grown synthetic diamond and a natural diamond.

4. The method of claim 1 wherein the growth faces (100) are exposed to the plasma.

5. The method of claim 1 wherein the CVD chamber is maintained at a pressure ranging from 80 to 220 torr.

6. The method of claim 1 wherein the diamond forming gas comprises a carbon containing substance and a carrier.

7. The method of claim 6 wherein the carbon containing substance is a hydrocarbon of up to 5 carbon atoms.

8. The method of claim 6 wherein the carbon containing substance is methane.

9. The method of claim 6 wherein the carrier is hydrogen.

10. The method of claim 6 wherein the concentration of methane is 2 to 24 percent by volume of the diamond forming gas.

11. The method of claim 1 wherein the diamond growth occurs in the wedge at the rate of 5 to 150 microns per hour.

12. The method of claim 1 wherein the large homoepitaxial monocrystalline diamond has the length and width up to 20 mm.

13. The method of claim 1 further comprising obtaining variation in the thickness of the diamond growth in the wedge between the at least two substrates by varying the time period from 1 hour to 200 hours.

14. The method of claim 1 further comprising adding dopants to obtain colored diamond growth in the wedge between the at least two substrates.

15. The method of claim 1 wherein the at least two substrates are the grown diamonds produced by said method, wherein the grown diamonds are joined to produce a larger homoepitaxial monocrystalline diamond by further deposition.

16. A method for producing a homoepitaxial monocrystalline diamond, the method comprising the steps of:
a. positioning at least two diamond substrates in a chemical vapor deposition vacuum chamber wherein the at least two diamond substrates are positioned with respect to each other such that growth faces of the at least two substrates form a wedge and other faces are masked, wherein the growth faces have a crystallographic orientation of (100);
b. providing a diamond forming gas adjacent to the at least two diamond substrates in the chemical vapor deposition vacuum chamber, wherein the diamond forming gas contains 2 to 24 percent of carbon containing substance;
c. generating a plasma from the diamond forming gas by exposing the diamond forming gas to microwave radiation; and
d. exposing the at least two diamond substrates to the plasma under conditions wherein diamond growth occurs in the wedge between the at least two diamond substrates so that the at least two substrates are joined to form a homoepitaxial monocrystalline diamond, wherein the at least two substrates are maintained at temperatures ranging from 800° C. to 1600° C.

* * * * *